(12) United States Patent
Kuwajima et al.

(10) Patent No.: US 9,178,264 B2
(45) Date of Patent: Nov. 3, 2015

(54) DIRECTIONAL COUPLER AND WIRELESS COMMUNICATION DEVICE

(71) Applicant: TDK Corporation, Tokyo (JP)

(72) Inventors: Hajime Kuwajima, Tokyo (JP); Toshiyasu Fujiwara, Tokyo (JP); Naoto Ohyama, Tokyo (JP); Yoshikazu Tsuya, Tokyo (JP); Masami Sasaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 14/638,803

(22) Filed: Mar. 4, 2015

(65) Prior Publication Data

US 2015/0180112 A1  Jun. 25, 2015

Related U.S. Application Data

(62) Division of application No. 13/554,175, filed on Jul. 20, 2012, now abandoned.

(30) Foreign Application Priority Data

Jul. 27, 2011  (JP) .................................. 2011-164362
Aug. 25, 2011  (JP) .................................. 2011-183999

(51) Int. Cl.
*H01P 5/18* (2006.01)
*H03H 7/01* (2006.01)
*H04B 1/04* (2006.01)
*H04B 1/00* (2006.01)
*H01P 3/08* (2006.01)

(52) U.S. Cl.
CPC ............... *H01P 5/18* (2013.01); *H03H 7/0138* (2013.01); *H04B 1/0053* (2013.01); *H04B 1/0458* (2013.01)

(58) Field of Classification Search
CPC ................................... H01P 5/18; H01P 5/184
USPC .................................. 333/109, 110, 112, 116
See application file for complete search history.

(56) References Cited

U.S. PATENT DOCUMENTS 6,150,898 A   11/2000  Kushitani et al.
6,515,556 B1  2/2003   Kato et al.
(Continued)

FOREIGN PATENT DOCUMENTS

DE  10 2010 040 290 A1  3/2011
JP       10-290108 A    10/1998
(Continued)

OTHER PUBLICATIONS

Chinese Office Action issued Apr. 29, 2014 in Chinese Patent Application No. 201210265531.4 (w/English translation).

(Continued)

*Primary Examiner* — Dean Takaoka
(74) *Attorney, Agent, or Firm* — Oblon, McClelland, Maier & Neustadt, L.L.P.

(57) ABSTRACT

A directional coupler according to the present invention includes a primary line for transmitting a transmission signal; an input port for inputting the transmission signal to the primary line; an output port for outputting the transmission signal from the primary line; a secondary line for electromagnetically coupling with the primary line to extract part of the transmission signal; a coupling port provided at one end of the secondary line; an isolation port provided at the other end of the secondary line; and a low pass filter unit having a function of low pass filter, disposed between the secondary line and the coupling port.

17 Claims, 16 Drawing Sheets

(56) References Cited

U.S. PATENT DOCUMENTS

| | | |
|---|---|---|
| 7,705,692 B2 | 4/2010 | Fukamachi et al. |
| 8,629,736 B2 * | 1/2014 | Tamaru ........................ 333/109 |
| 2004/0113716 A1 | 6/2004 | Hilal et al. |
| 2005/0212617 A1 | 9/2005 | Chen |
| 2007/0279147 A1 | 12/2007 | Dupont et al. |
| 2011/0057746 A1 | 3/2011 | Yamamoto et al. |
| 2011/0187349 A1 | 8/2011 | Yamamoto et al. |
| 2012/0161897 A1 | 6/2012 | Tamaru et al. |

FOREIGN PATENT DOCUMENTS

| | | |
|---|---|---|
| JP | 2002-280812 | 9/2002 |
| JP | 2004-289797 A | 10/2004 |
| JP | 2009-27617 | 2/2009 |
| JP | 2009-44303 A | 2/2009 |
| JP | 2011-61440 | 3/2011 |
| WO | WO 2011/074370 A1 | 6/2011 |

OTHER PUBLICATIONS

Office Action issued Jul. 3, 2013 in Japanese Patent Application No. 2011-164362.

Office Action issued Jul. 3, 2013 in Japanese Patent Application No. 2011-183999.

European Search Report issued Mar. 20, 2013 in Patent Application No. 12178054.8.

* cited by examiner

DIRECTIONAL COUPLER AND WIRELESS COMMUNICATION DEVICE

CROSS-REFERENCE TO RELATED APPLICATION

This application is a divisional of U.S. Ser. No. 13/554,175 filed Jul. 20, 2012 which claims priority to Japanese Patent Application No. 2011-164362 filed on Jul. 27, 2011 and Japanese Patent Application No. 2011-183999 filed on Aug. 25, 2011, the entire contents of which are incorporated herein by reference.

BACKGROUND OF THE INVENTION

The present invention relates to a directional coupler and a wireless communication device, and more particularly, to techniques for providing a flat frequency characteristic for the degree of coupling in the directional coupler.

A directional coupler (hereinafter simply referred to as the "coupler"), which enables extraction of part of power propagated on a transmission line, has become an indispensable component for designing a transmitter circuit of a variety of wireless communication devices such as portable telephones, wireless LAN communication device, communication devices of Bluetooth standard, and the like.

Specifically, a coupler forms part of an adjuster means for controlling a transmission signal to maintain at a certain level. The adjuster means comprises a power amplifier (hereinafter referred to as the "PA") capable of controlling a gain; a coupler for detecting the level of a transmission signal; and an automatic output control circuit (hereinafter referred to as the "APC circuit"). An inputted transmission signal is amplified by the PA, and subsequently outputted through the coupler. The coupler provides the APC circuit with a monitor signal which is at a level corresponding to the level of the transmission signal outputted from the PA. The APC circuit controls the gain of the PA such that the output of the PA remains constant in accordance with the level of the monitor signal (i.e., the level of the transmission signal). Such feedback control of the PA facilitates stabilization of transmission output.

The foregoing coupler comprises a primary line and secondary line which are disposed in close proximity to each other to make electromagnetic coupling therebetween. The primary line for transmitting a transmission signal comprises an input port at one end thereof, and an output port at the other end thereof, respectively. The secondary line for detecting the level of a transmission signal comprises a coupling port at one end thereof and an isolation port at the other end thereof, respectively. Then, part of a transmission signal transmitted through the primary line is extracted by the secondary line, and is outputted to the APC circuit through the coupling port, as a monitor signal.

Main characteristics of a coupler may include insertion loss, degree of coupling, isolation, and directivity. The insertion loss is a loss caused by the coupler, and is desired to be lower. The degree of coupling indicates the ratio of power propagating in a forward direction (direction from an input port to an output port of a primary line) to power extracted to a coupling port. The isolation indicates a leakage of power propagating in a reverse direction (direction from the output port to the input port of the primary line) to the coupling port, and is desired to be higher (a smaller leakage). The directivity, in turn, indicates the difference between isolation and degree of coupling, and a better coupler is defined to exhibit a higher directivity (larger absolute value), allowing for the formation of a satisfactory APC circuit with few detection errors. For this reason, the directivity is generally required to be 20 dB or more.

On the other hand, portable terminals represented by portable telephones and smart phones employ different communication frequency bands depending on countries and regions, so that communication devices which can employ a plurality of frequency bands have been recently provided in order to flexibly accommodate such a circumstance of frequency. For example, there are a dual-band system which can employ two frequency bands; a triple band system which can employ three frequency bands; even a quad-band system which can employ four frequency bands, and so on.

The following patent documents relate to such a coupler:
Patent Document 1: JP-A-2002-280812;
Patent Document 2: JP-A-2011-61440; and
Patent Document 3: JP-A-2009-27617.

SUMMARY OF THE INVENTION

In particular, the degree of coupling, which indicates the ratio of power propagated as a transmission signal to power extracted to a coupling port of a coupler preferably exhibits a flat frequency characteristic from a viewpoint of implementing highly accurate control for transmission power (precise feedback control of PA). Generally, a flat degree of coupling can be accomplished in an associated frequency band when the length of a primary line and a secondary line is set approximately to one quarter wavelength.

However, in a semi-micro wave mainly used by mobile radio devices such as portable telephones, one quarter wavelength is very long, approximately 25 cm to 3 cm (for example, 3 cm for 10 GHz), so that it is not feasible from a viewpoint of the size to provide a coupling line of this length in a coupler for use in mobile radio devices such as portable telephones and the like which are required to be reduced in weight, thickness, length, and size. Also, the use of a long coupling line equal to or larger than several centimeters would result in an extremely large insertion loss, which can cause a signification degradation of the battery life, which is a fatal disadvantage for mobile radio devices. Thus, it is common to employ a coupler which has a coupling line shorter than one quarter wavelength of a used frequency band. However, such a coupling line generally tends to suffer from varying characteristics depending on the frequency and to exhibit the degree of coupling which increases as the frequency is higher (for example, see FIG. 6(b) of Patent Document 1 cited above).

On the other hand, in third-generation portable telephone systems such as UMTS (Universal Mobile Telecommunications System) and 3G, the degree of coupling must be maintained constant over a wide range of 800 to 2200 MHz in roder to cover, for example, from Band 1 (1920-2170 MHz) to Band 5 (824-894 MHz), however, couplers which satisfy such specifications are not currently available on the market.

Conventionally, therefore, a plurality of couplers must be provided for designing a device which uses a wide frequency band. For example, FIG. 27 is a block diagram showing an exemplary transceiver of a portable telephone which can employ a plurality of frequency bands. As shown in FIG. 27, in a conventional multi-band portable telephone, transmitter circuits 301, 401, provided in correspondence to used frequency bands, comprise couplers 311, 411, respectively. In FIG. 27, the transceiver comprises an antenna 101, and a switch 102 for distributing radio waves received through the antenna 101 to receiver circuits 103, 104 and for delivering a transmission signal supplied from the transmitter circuit 301,

401 to the antenna 101. The switch 102 is constructed, for example, by combining a diplexer and a high-frequency switch.

In another aspect, when a coupler can be shared in such a multi-band communication device (for example, a single coupler is provided), the number of parts can be reduced in the transmitter circuits to reduce the manufacturing cost of the device. Also, the portable communication device can be further reduced in size. Moreover, making the degree of coupling flat in a coupler is preferable in controlling transmission power in a simpler manner with less detection errors. It should be noted that any of the above-cited Patent Documents does not propose such a concept of the present invention and solutions therefor.

Further, in recent years, the inauguration of a new communication service, referred to as "LTE" (Long Term Evolution), is expected for portable telephones under a new communication standard. According to this standard, a yet wider frequency band of 700-2700 MHz will be used. Here, while the degree of coupling is better with higher flatness (smaller variation width), it is assumed that a coupler can be generally provided for practical use if the variation width can be suppressed to 6 dB or lower in an associated band (more preferably to 4.5 dB or lower). In contrast, assuming that a coupler described in Patent Document 1, for example, is used, the variation width is as high as approximately 9 dB in the frequency band of 700-2700 MHz (see FIG. 6(B) of Patent Document 1), making the coupler intolerable in practical use.

It is therefore an object of the present invention to provide a coupler which exhibits a flat degree of coupling over a wide band.

To solve the above-mentioned problem and achieve the object, a coupler (directional coupler) according to the present invention comprises a primary line for transmitting a transmission signal; an input port for inputting the transmission signal to the primary line; an output port for outputting the transmission signal from the primary line; a secondary line for electromagnetically coupling with the primary line to extract part of the transmission signal; a coupling port provided at one end of the secondary line; an isolation port provided at the other end of the secondary line; and a low pass filter unit having a function of low pass filter, disposed between the secondary line and the coupling port.

As described above in Summary of the Invention, the present invention was able to be completed during investigations regarding a replacement of a plurality of couplers conventionally required in a multi-band communication device with a single common coupler. The inventors found that in a coupler which employs a primary line for transmitting a transmission signal, and a secondary line disposed in close proximity to the primary line for electromagnetic coupling therewith, a flat frequency characteristic could be provided for the degree of coupling of the coupler if a low pass filter unit (hereinafter referred to as the "LPF unit") is disposed between the secondary line and the coupling port, and the present invention was created based on this insight.

The LPF unit has functions of blocking (attenuating) signals at high frequencies and passing signals at lower frequencies, and also serves to prevent the degree of coupling of the coupler from varying depending on the frequency (the degree of coupling increases at higher frequencies). In this way, the frequency characteristic for the degree of coupling can be made flat over a wide band from low frequencies to high frequencies. In this regard, a detailed description will be given later in Description of Embodiments based on the results of simulations.

As to a specific configuration of the LPF unit, the LPF unit may include an inductor connected in series between the secondary line and the coupling port, and a capacitor having one end connected between the secondary line and the coupling port and the other end connected to the ground.

Also, the coupler of the present invention may further comprise (1) a capacitor having one end connected between the primary line and the input port and the other end connected between the secondary line and the coupling port, or (2) a capacitor having one end connected between the primary line and the input port, and the other end connected to the ground.

While the degree of coupling can be made flat by providing the LPF unit as described above, degradations in isolation and directivity are sometimes experienced in the coupler additionally provided with the LPF unit. Therefore, as a result of an attempt to improve these characteristics while maintaining the flatness for the degree of coupling in such an event, the inventors found that the degradations could be corrected in isolation and directivity, and these characteristics could be improved by employing the solution (1) or (2) for adding the capacitor. In this regard, a detailed description will be given later in Description of Embodiments.

Also, in one aspect of the present invention, the coupler may further comprise, in addition to the low pass filter unit (LPF unit connected between the secondary line and the coupling port, which is hereinafter sometimes referred to as the "first LPF unit"), another low pass filter unit (hereinafter sometimes referred to as the "second LPF unit") having a function of low pass filter, disposed between the secondary line and the isolation port.

According to the foregoing aspect comprising the LPF units at both ends of the secondary line, the frequency characteristic for the degree of coupling can be made flat not only in a direction from the input port to the output port of the primary line (this direction is referred to as the "forward direction") but also a direction from the output port to the input port of the primary line (this direction is referred to as the "reverse direction"). For example, when a reflected wave propagating in the reverse direction is extracted from the isolation port for monitoring in order to detect and measure matching with the antenna (reflected power from the antenna) in a radio communication device, a more precise detection can be made with less erros in a manner similar to the forward direction, according to this aspect which can provide for the flat degree of coupling in the reverse direction.

Regarding a preferred configuration of the LPF units in this aspect, the first LPF unit (LPF unit disposed between the secondary line and the coupling port) may include an inductor connected in series between the secondary line and the coupling port, and a capacitor having one end connected between the secondary line and the coupling port and the other end connected to the ground, while the second LPF unit (LPF unit disposed between the secondary line and the isolation port) may include an inductor connected in series between the secondary line and the isolation port, and a capacitor having one end connected between the secondary line and the isolation port and the other end connected to the ground.

Additionally, in the present invention, the coupler may further comprise a capacitor having one end connected between the secondary line and the coupling port, and the other end connected between the secondary line and the isolation port, and the resulting coupler excels similarly in flatness for the degree of coupling.

On the other hand, the inventors found that, instead of simply adding an LPF unit to a conventional coupler as described above, the degree of coupling can be made flat in a used frequency band by adding an LPF unit so as to form a resonant point on the higher side of the used frequency band.

Specifically, the thus configured coupler similarly comprises an LPF unit, where the LPF unit is configured to form a resonant point (a pole for attenuating the degree of coupling) on a higher side (at a frequency position close to the used frequency band in a frequency range higher than the used frequency band) of the used frequency band to make the degree of coupling flat in the used frequency band. The LPF unit thus configured facilitates making the degree of coupling flat.

The resonant point can be formed at a position (resonant frequency) which may be adjusted by manipulating the specific configuration of the LPF, i.e., the configuration of circuit elements which make up the LPF unit (for implementing a low pass filter function), or the capacitance, inductance, resistance, and the like of each circuit element (capacitor, inductor, and resistor). In a preferred aspect of the present invention, the difference between a resonant frequency Fr and a center frequency Fc is normalized by the bandwidth BW and the center frequency to derive a value (Fr−Fc)/Fc/BW, and the resonant point is set such that the normalized value is within a range of 0.6 to 1.2 inclusive, more preferably in a range of 0.65 to 0.9, where the used frequency band is defined by a lower limit frequency F1, a higher limit frequency F2, the center frequency Fc, and the bandwidth BW, and the resonant frequency Fr is the frequency at the resonant point. The center frequency Fc is represented by (F1+F2)/2.

In this way, the flatness for the degree of coupling can be improved within the used frequency band. In regard to the relationship between the resonant point and the used frequency band, a detailed description will be given below in Description of Embodiments based on the result of simulations.

Also, from a viewpoint of suppressing a variation width of the degree of coupling within the used frequency to similarly improve the flatness, in another aspect of the present invention, the resonant point may be formed such that the degree of coupling at the lower limit frequency F1 of the used frequency band is substantially equal to the degree of coupling at the higher limit frequency F2 of the used frequency band.

Further, when the flatness is improved by the formation of the resonant point as described above, a specific configuration of the LPF unit may also include an inductor connected in series between the secondary line and the coupling port, and a capacitor having one end connected between the secondary line and the coupling port and the other end connected to the ground. Further, in addition to the LPF unit (first LPF unit) connected between the secondary line and the coupling port, the coupler may comprise another LPF unit (second LPF unit) between the secondary line and the isolation port. Furthermore, the coupler may comprise a capacitor having one end connected between the secondary line and the coupling port and the other end connected between the secondary line and the isolation port, and the resulting coupler will excel as well in flatness for the degree of coupling.

Each of the couplers according to the present invention may further comprise an attenuator connected one or both of between the secondary line and the coupling port and between the secondary line and the isolation port.

By thus adding the attenuator to the secondary line, the attenuator can mitigate the influence due to variations in impedance of other circuit elements possibly connected to the secondary line. As such, when the coupler of the present invention is actually incorporated into a device for practical use, the coupler can be less susceptible to the influence by other circuit elements.

Also, the coupler having the attenuator thus connected may comprise a reactance unit having a reactive element, connected within the attenuator or between the coupling port and the isolation port.

The reactance component is added to optimize the degree of coupling, directivity, and the like of the coupler by adjusting the impedance. The reactance element used herein may be, for example, an inductor or a capacitor.

A radio communication device according to the present invention may include any of the couplers according to the present invention.

Specifically, the radio communication device an antenna capable of transmitting a signal; a coupler for detecting a level of a transmission signal transmitted to the antenna; and a transmitter circuit capable of generating at least a transmission signal in a first communication frequency band and a transmission signal in a second communication frequency band different from the first communication frequency band. Then, the coupler may be any of the aforementioned couplers according to the present invention, and may be connected between the antenna and the transmission circuit (as a common coupler for detecting the level of a transmission signal in the first communication frequency band and the level of a transmission signal in the second communication frequency band) such that both the transmission signal in the first communication frequency band and the transmission signal in the second communication frequency band can be inputted into the coupler.

The radio communication device, referred to in the present invention, typically includes a portable terminal such as a portable telephone and a smart phone, PDA (Personal Digital Assistants) and tablet computer which provide for radio communication functions, but is not so limited, and the present invention encompasses a variety of communication devices such as a wireless LAN communication device, a communication device of Bluetooth standard, and the like.

Accordingly, the present invention provides for a small coupler which exhibits a flat degree of coupling over a wide band width and excels in isolation and directivity.

Other objects, features and advantages of the invention will become apparent from the following description of the embodiments of the invention taken in conjunction with the accompanying drawings. In the drawings, similar reference characters denote similar elements throughout the several views.

DESCRIPTION OF THE EMBODIMENTS

[First Embodiment]

Figure 1:
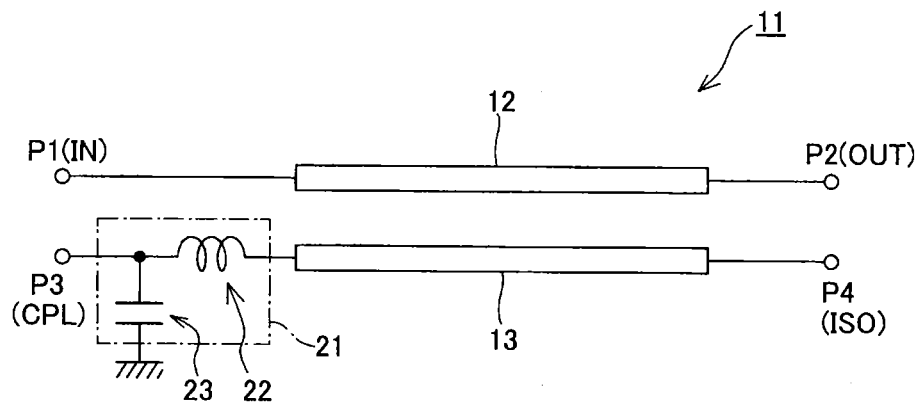
FIG. 1 is a diagram showing a coupler according to a first embodiment of the present invention.

As shown in FIG. 1, a coupler 11 according to a first embodiment of the present invention comprises a primary line 12 for transmitting a transmission signal, and a secondary line 13 disposed in close proximity to the primary line 12 for electromagnetic coupling therewith. The primary line 12 has an input port P1 at one end thereof, and an output port P2 at the other end thereof. The secondary line 13, in turn, has a coupling port P3 at one end thereof, and an isolation port P4 at the other end thereof. In the following description, the input port may be sometimes referred to as "P1," the output port as "P2," the coupling port as "P3," and the isolation port as "P4," respectively.

Also, as described above, the degree of coupling can be made flat if the length of the primary line and secondary line is set to approximately one quarter wavelength of a used frequency band. However, since this designing results in extremely long primary line and secondary line, both the primary line and secondary line in the first embodiment have a length shorter than one quarter wavelength of a used frequency band.

An LPF unit 21 is disposed between the secondary line 13 and coupling port P3. This LPF unit 21 is a so-called L-type low pass filter made up of an inductor 22 and a capacitor 23, where the inductor 22 is inserted in series between the secondary line 13 and coupling port P3, and the capacitor 23 is connected between a transmission line between the secondary line 13 and coupling port P3 and the ground.

Figure 2:
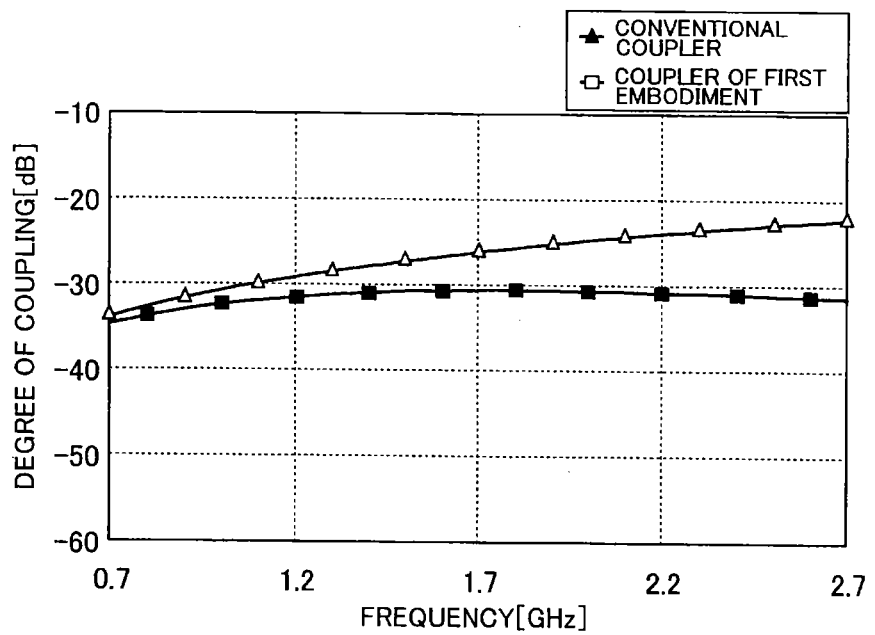
FIG. 2 is a graph representing the frequency characteristic for the degree of coupling of the coupler according to the first embodiment in comparison with that of a conventional coupler.
Figure 3:
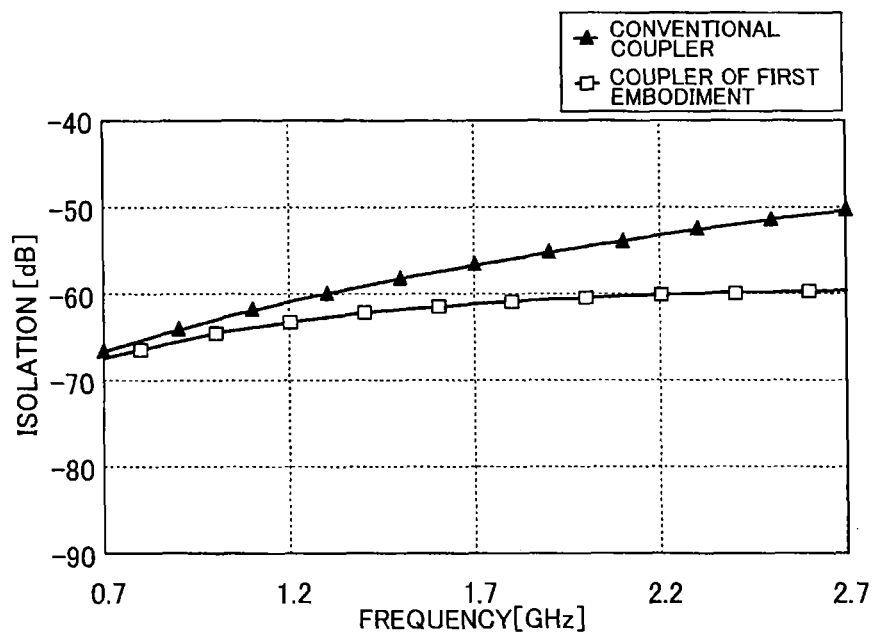
FIG. 3 is a graph representing the frequency characteristic for isolation of the coupler according to the first embodiment, in comparison with that of a conventional coupler.

FIG. 2 and FIG. 3 show the result of a simulation performed to reveal the frequency characteristic for the degree of coupling (FIG. 2) and isolation (FIG. 3) of the coupler 11 according to this embodiment, respectively, in comparison with that of a conventional coupler (which does not comprise the LPF unit 21). For reference, the inductor 22, forming part of the LPF unit 21, has the inductance of 2.7 nH, and the capacitor 23 has the capacitance of 5 pF.

As shown in FIG. 2, when a used frequency band is assumed to be, for example, from 700 MHz to 2.7 GHz, the conventional coupler fails to satisfy the prescription for the degree of coupling, which dictates that a variation width should be equal to or less than 6 dB which is generally required, within this frequency band. In contrast, according to this embodiment which comprises the LPF unit 21 at the coupling port, it is understood that the degree of coupling can be made flat, as compared with the conventional one, and that the coupler 11 can satisfy the prescription of 6 dB or less. Also, as shown in FIG. 3, the isolation can be improved over the conventional coupler.

Thus, since the degree of coupling can be made flat according to this embodiment, it is possible to reduce the number of couplers disposed in a device which is used over a wide frequency band.

[Radio Communication Device]

Assuming that a dual-band portable telephone is designed to be capable of utilizing two communication frequency bands, i.e., 800-MHz band and 2-GHz band, by way of example, transmitter circuits for the respective frequency bands must be conventionally provided with two couplers, one for each transmitter circuit, which are adjusted such that their degrees of coupling are substantially equal to each other (see FIG. 18), because the degree of coupling largely varies in the 800-MHz band and 2-GHz band. In contrast, according to the foregoing embodiment, since the degree of coupling is substantially flat over the two frequency bands (800-MHz band and 2-GHz band), a common coupler may be provided for the two frequency bands, thus making it possible to reduce the number of parts to simplify the transmitter circuits. It should be noted that the foregoing advantage can be similarly provided by couplers according to other embodiments and exemplary modifications thereto, later described.

Figure 4:
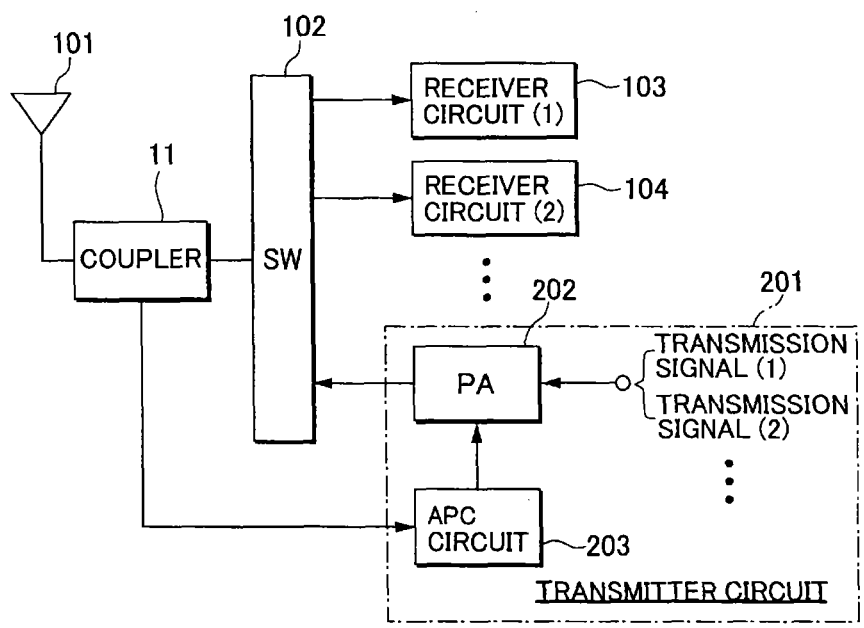
FIG. 4 is a block diagram showing an exemplary configuration of a multi-band portable telephone which incorporates the coupler of the first embodiment.
Figure 27:
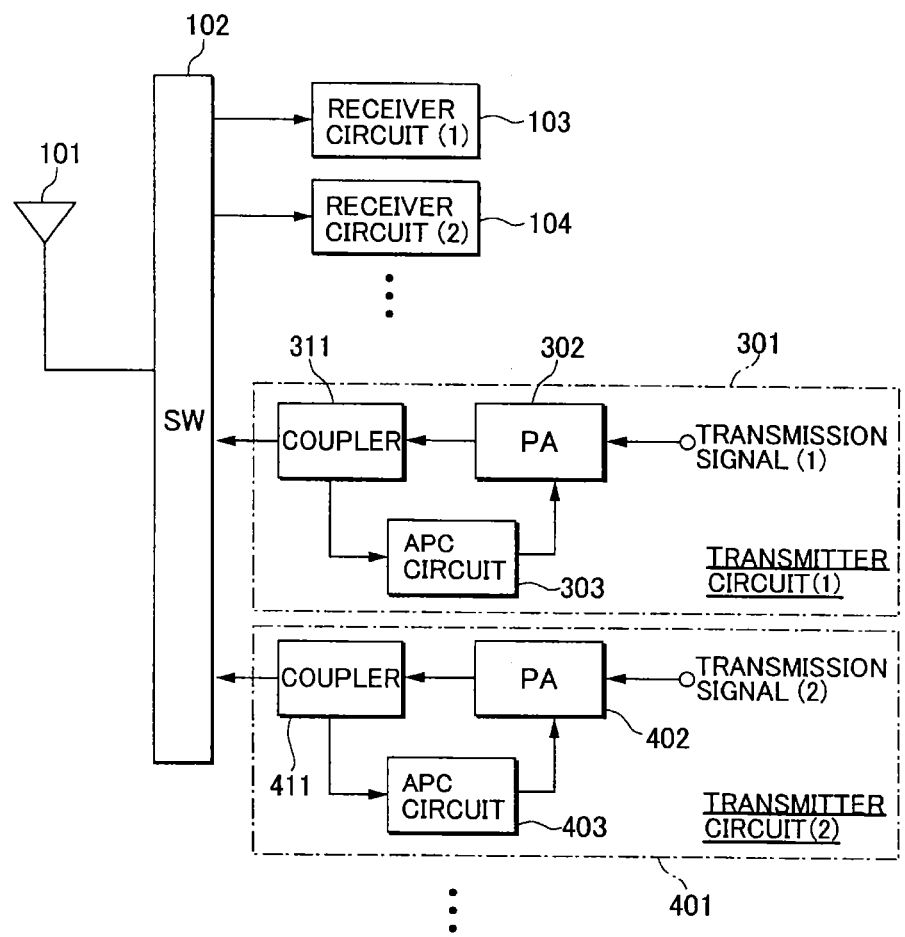
FIG. 27 is a block diagram showing an exemplary transceiver for a conventional multi-band portable telephone.

FIG. 4 shows an exemplary configuration of a transceiver for a multi-band portable telephone which employs the coupler 11 of the first embodiment. As shown in FIG. 4, according to the embodiment, a single coupler 11 may be interposed between an antenna 101 and a switch 102, so that a transmitter circuit 201 can be simplified as compared with the conventional one (see FIG. 27). Specifically, the transceiver employs PA 202 available for the two frequency bands. A monitor signal (signal corresponding to the level of a transmission signal) fed through the coupler 11 is applied to an APC circuit 203 which in turn controls the gain of PA 202 in accordance with the level of the monitor signal (i.e., the level of the transmission signal) such that PA 202 delivers a constant output. Also, a switch 102 performs functions of distributing radio waves received through the antenna 101 to receiver circuits 103, 104, and delivering a transmission signal inputted from the transmitter circuit 201 to the antenna 101, and may be constructed, for example, by combining a diplexer and a high-frequency switch.

[Second Embodiment]

Figure 5:
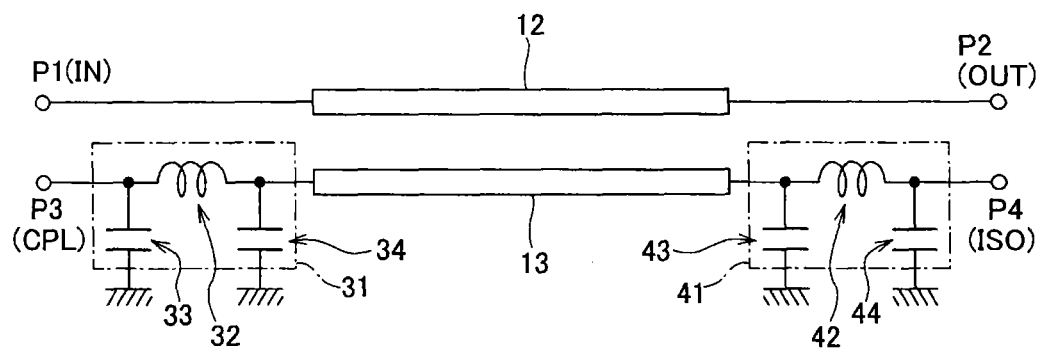
FIG. 5 is a diagram showing a coupler according to a second embodiment of the present invention.

As shown in FIG. 5, a coupler according to a second embodiment of the present invention comprises an LPF unit (first LPF unit) 31 between a secondary line 13 and a coupling port P3, as is the case with the first embodiment, and additionally comprises an LPF unit (second LPF unit) 41 between the secondary line 14 and isolation port P4.

Notably, in this embodiment, each of the LPF units 31, 41 is a so-called n-type low pass filter which comprises two capacitors 33, 34; 43, 44 connected in parallel at both ends of the inductor 32, 42 which are connected in series. The first LPF unit 31 is made up of the inductor 32 inserted in series between the secondary line 13 and coupling port P3, and the capacitors 33, 34 connected at both ends of the inductor 32, respectively, between the transmission line and the ground which are located between the secondary line 13 and coupling port P3. The second LPF unit 41, in turn, is made up of the inductor 42 inserted in series between the secondary line 13 and isolation port P4, and the capacitors 43, 44 connected at both ends of the inductor 42, respectively, between the transmission line and the ground which are located between the secondary line 13 and isolation port P4. Alternatively, the LPF units 31, 41 may be L-type low pass filters, like those in the first embodiment, or may be so-called T-type low pass filters, each comprising two inductors connected in series and a capacitor connected between a point between the two inductors and the ground.

According to the coupler of the second embodiment which comprises the LPF units 31, 41 disposed in a symmetric configuration on either side of the coupler body made up of the primary line 12 and secondary line 13 (both on the input side and output side), not only the frequency characteristic for the degree of coupling can be made flat in the forward direction as in the first embodiment, but also the frequency characteristic for the degree of coupling in the reverse direction (power inputted from the output port P2 of the primary line and outputted to the isolation port P4) can be made flat by the action of the second LPF unit 41, like that in the forward direction. Consequently, when a reflected wave which propagates in the reverse direction is extracted from the isolation port P4 for monitoring in order to detect and measure matching with an antenna, for example, in a radio communication device (reflected power from the antenna), as described above, a precise detection can be performed with less errors in a similar manner to the forward direction.

[Third Embodiment]

Figure 6:
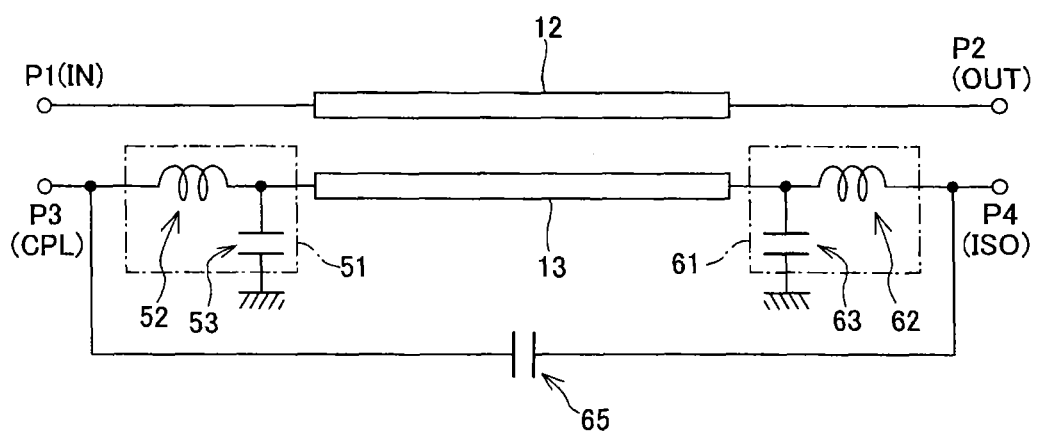
FIG. 6 is a diagram showing a coupler according to a third embodiment of the present invention.

As shown in FIG. 6, a coupler according to a third embodiment of the present invention comprises LPF units 51, 61 on both sides of a secondary line 13 (between a coupling port P3 and the secondary line 13 and between an isolation port P4 and the secondary line 13), respectively, as is the case with the coupler according to the second embodiment, and further in addition to these, comprises a capacitor 65 connected between the coupling port P3 and the isolation port P4. Here, each of the LPF units 51, 61 is an L-type low pass filter made up of an inductor 52, 62 and a capacitor 53, 63, similar to those of the first embodiment.

Figure 7:
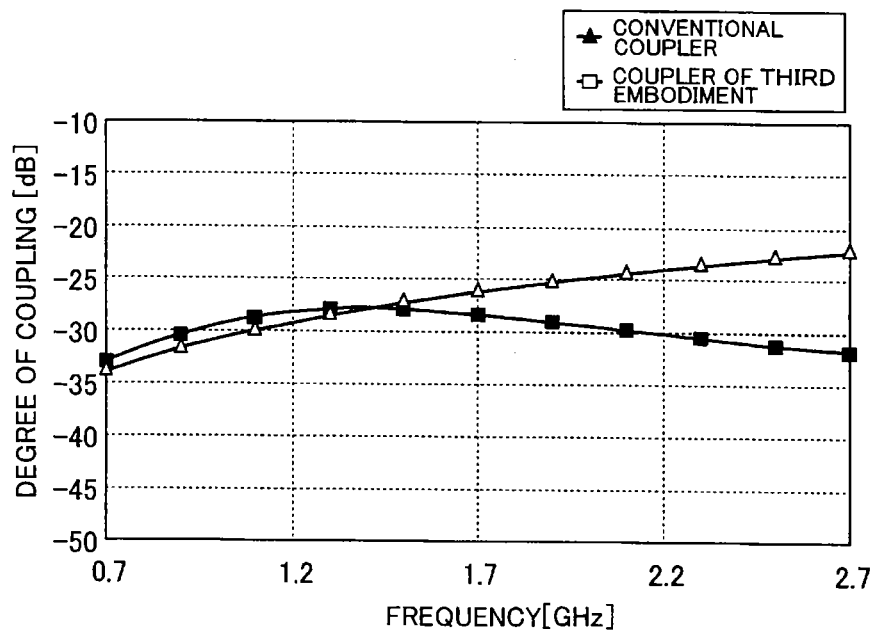
FIG. 7 is a graph representing the frequency characteristic for the degree of coupling of the coupler according to the third embodiment in comparison with that of a conventional coupler.
Figure 8:
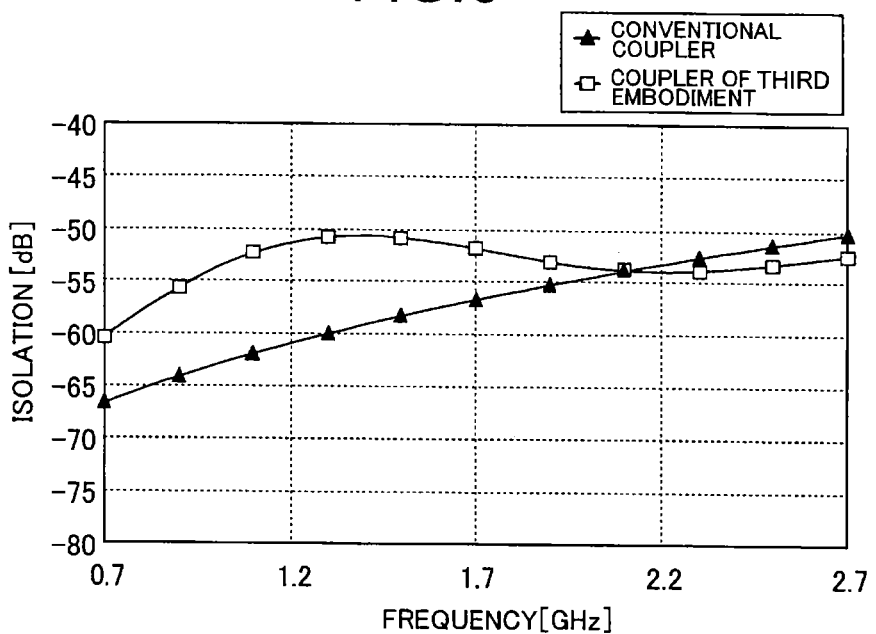
FIG. 8 is a graph representing the frequency characteristic for isolation of the coupler according to the third embodiment, in comparison with that of a conventional coupler.

FIGS. 7 and 8 show the result of a simulation performed to reveal the frequency characteristic for the degree of coupling (FIG. 7) and isolation (FIG. 8) of the coupler according to the third embodiment, respectively, in comparison with those of a conventional coupler (which does not comprise the LPF units 51, 61 nor the capacitor 65 between P3 and P4), in a manner similar to FIGS. 2 and 3 described above. For reference, the inductors 52, 62, forming part of the LPF units 51, 61, respectively, both have the inductance of 5.5 nH, the capacitors 53, 63, forming part of the LPF units 51, 61, respectively, both have the capacitance of 2.2 pF, and the capacitor 65 between P3 and P4 has the capacitance of 1.2 pF.

As shown in FIG. 7, the coupler according to the third embodiment comprising the capacitor 65 between P3 and P4 can also make the degree of coupling more flat as compared with the conventional coupler.

Also, in the third embodiment, since the LPF units are quadratic L-type low pass filters, the number of components and the length of routed conductor lines can be reduced to suppress the generation of unwanted coupling components and resonance, as compared with the second embodiment which employs ternary n-type low pass filters for the LPF units, thereby making it possible to provide a flat frequency characteristic for the degree of coupling while improving the isolation characteristic and directivity.

Further in the third embodiment, the isolation characteristic and directivity can be improved by connecting the capacitor 65 between P3 and P4. As shown in FIGS. 7 and 8, the directivity (difference between the degree of coupling and the isolation) of 20 dB or more, which is required for practical use, can be ensured in a range of 0.7 to 2 GHz. In this regard, it is believed that the capacitor 65 between P3 and P4 provides for a phase adjustment function for canceling an unwanted leak current which inevitably introduces at the isolation port P4.

[Exemplary Modification to First Embodiment]

While the coupler 11 of the first embodiment can provide for a flat degree of coupling by adding the LPF unit 21, the LPF unit 21 connected in this way can sometimes cause a deterioration in isolation and directivity.

Specifically, the coupler establishes the directivity by a combination of an induced current and a displacement current on the secondary line. Therefore, a deterioration in isolation and directivity can often be caused by unwanted coupling between the coupling port and the output port, a phase shift of the induced current to the displacement current on the secondary line, and the like. In the first embodiment described above, on the other hand, the LPF unit 21 is connected to the secondary line 13. Presumably, the connection of the LPF unit 21 results in losing the balance of the phase difference between the induced current and displacement current on the secondary line 13, which can be a cause for giving rise to a deterioration in isolation and directivity.

Causes for the deterioration in isolation and directivity can include a variety of other factors (for example, a deterioration in signal separation due to a parasitic capacitance and unwanted coupling, deterioration in directivity due to a phase rate difference between an even mode and an odd mode which is found in a coupler, occurrence of impedance unmatching and unwanted resonance due to addition of a reactive element, and the like). In addition, mutual relationships between the connection of the LPF unit 21 and these various factors can also be involved in the deterioration. Accordingly, it cannot be said with absolute certainty that the connected LPF unit 21 immediately results in the deterioration in isolation and directivity. However, the inventors have found that such deterioration in characteristics, if any, could be solved by the following techniques.

Figure 9:
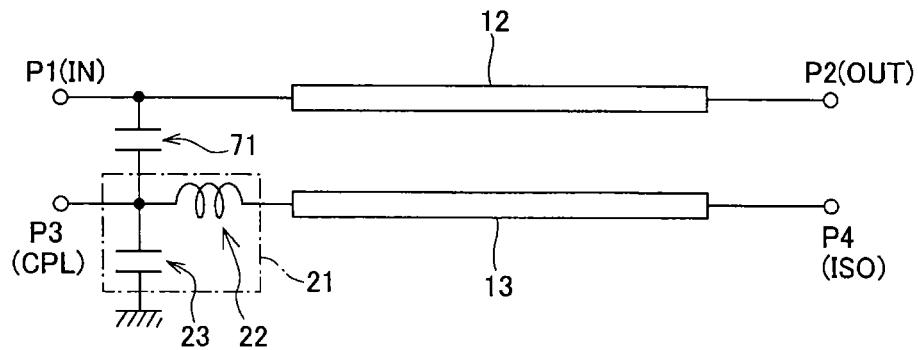
FIG. 9 is a diagram showing a coupler according to an exemplary modification to the first embodiment.

(1) A first technique includes further connecting a capacitor 71 between the input port P1 and the coupling port P3 in addition to the LPF unit 21, as shown in FIG. 9.

Figure 10:
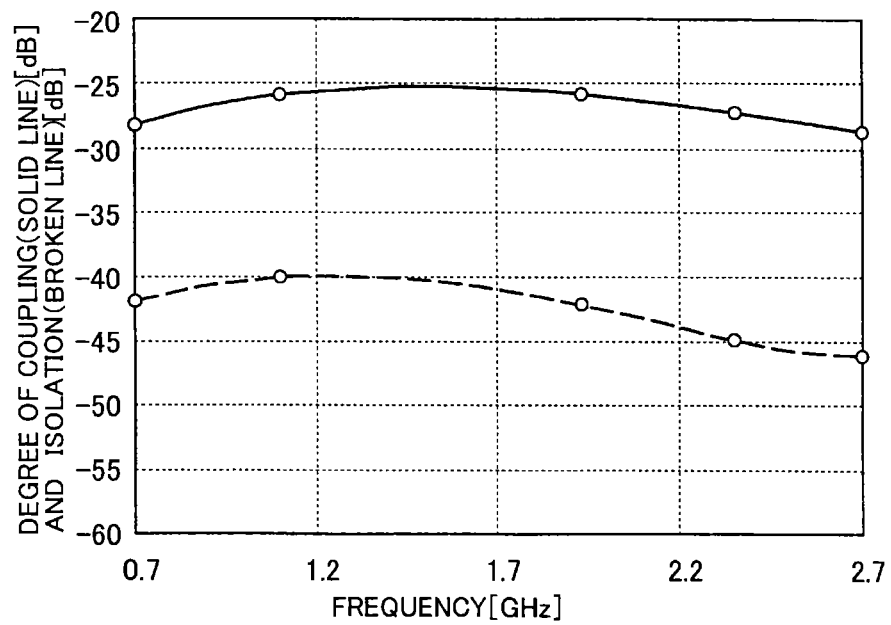
FIG. 10 is a graph representing the frequency characteristic (for the degree of coupling and isolation) of a coupler which additionally includes an LPF unit based on the first embodiment.
Figure 11:
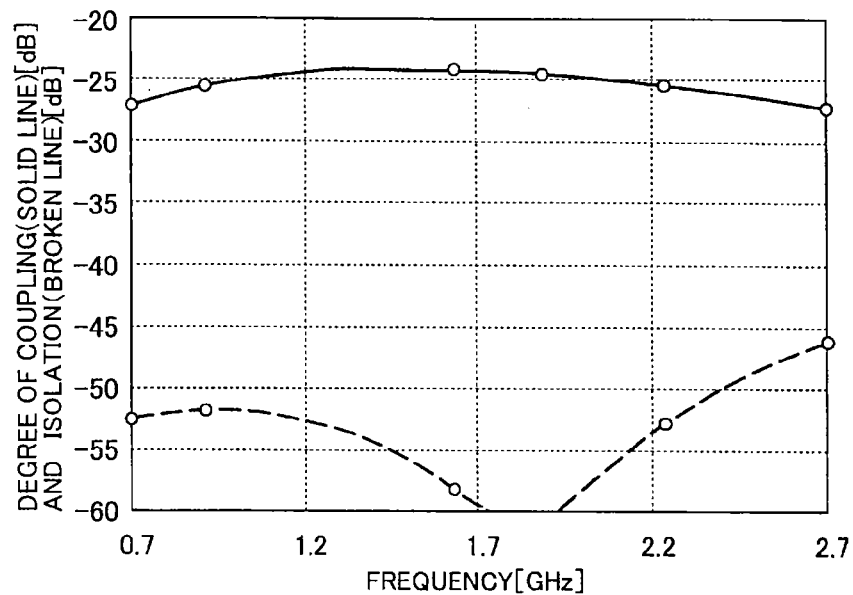
FIG. 11 is a graph representing the frequency characteristic (for the degree of coupling and isolation) of the coupler according to the exemplary modification to the first embodiment.

FIG. 10 shows the result of a simulation which represents the frequency characteristic for the degree of coupling (solid line) and isolation (broken line), exhibited by a coupler which comprises an LPF unit including an L-type low pass filter between a coupling port and a secondary line, like the first embodiment, and FIG. 11 shows the result of a simulation which represents the frequency characteristic for the degree of coupling (solid line) and isolation (broken line) of a coupler which applies the first technique. For reference, in the configurations associated with FIGS. 10 and 11, inductors 22 within the LPF units both have the inductance of 2.7 nH, capacitors 23 both have the capacitance of 5 pF, and the capacitor 71 connected between P1 and P3 has the capacitance of 1 pF.

As shown in FIGS. 10 and 11, by connecting the capacitor 71 between the input port P1 and the coupling port P3, the isolation (and therefore, the directivity which is the difference between the isolation and the degree of coupling as well) can be improved while maintaining a substantially equal degree of coupling.

Figure 12:
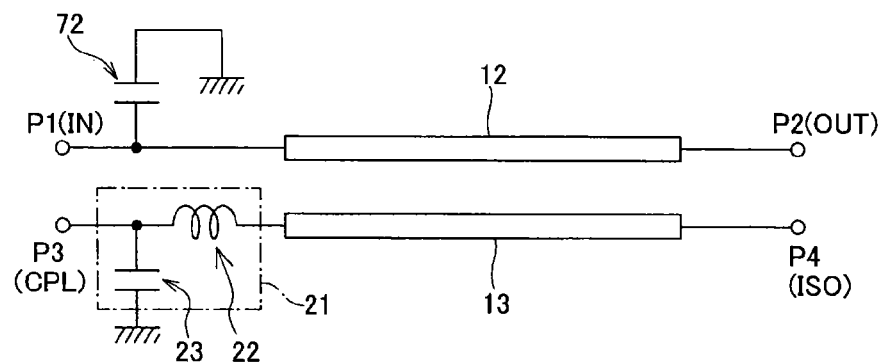
FIG. 12 is a diagram showing a coupler according to another exemplary modification to the first embodiment.

(2) A second technique includes further connecting a capacitor 72 between the input port P1 and the ground, in addition to the LPF unit 21, as shown in FIG. 12.

Figure 13:
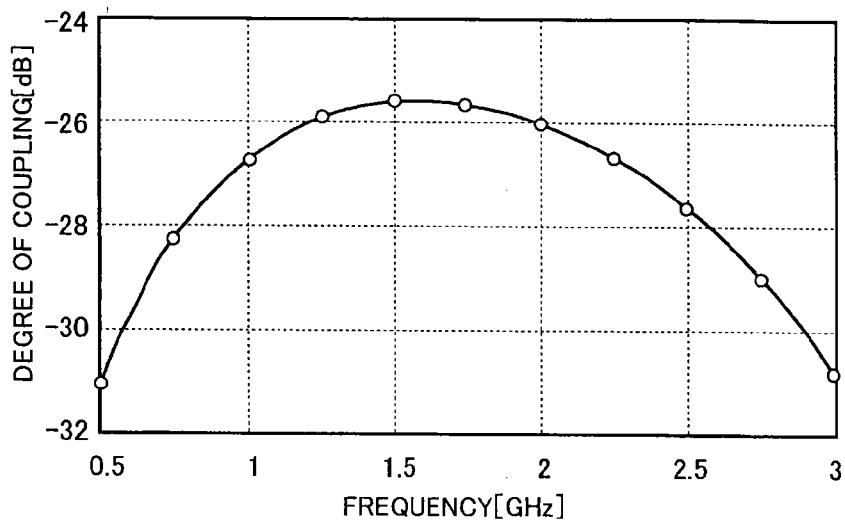
FIG. 13 is a graph representing the frequency characteristic (for the degree of coupling) of the coupler which additionally includes the LFP unit based on the first embodiment.
Figure 14:
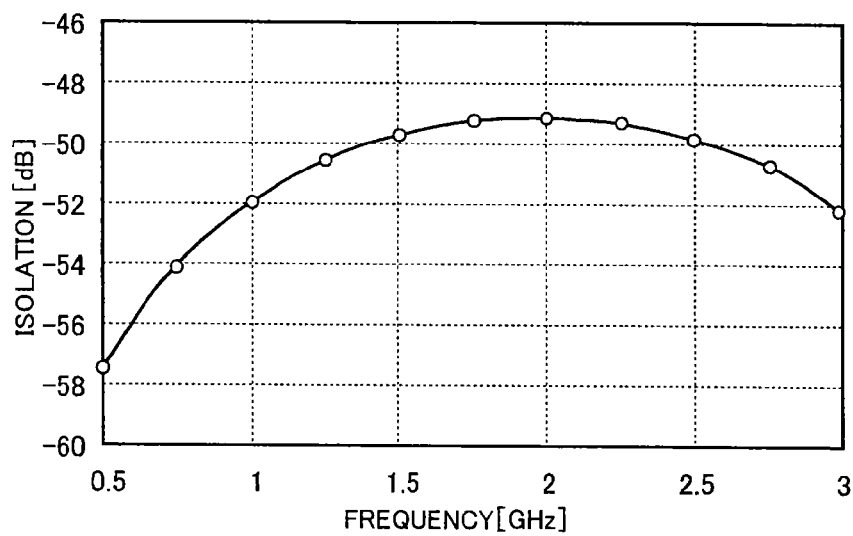
FIG. 14 is a graph representing the frequency characteristic (for isolation) of the coupler which additionally includes the LFP unit based on the first embodiment.
Figure 15:
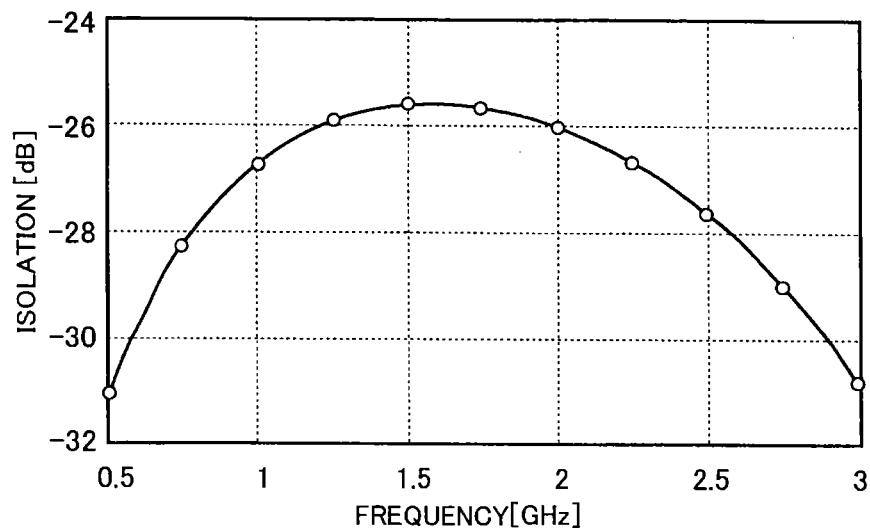
FIG. 15 is a graph representing the frequency characteristic (for the degree of coupling) of the coupler according to the other exemplary modification to the first embodiment.
Figure 16:
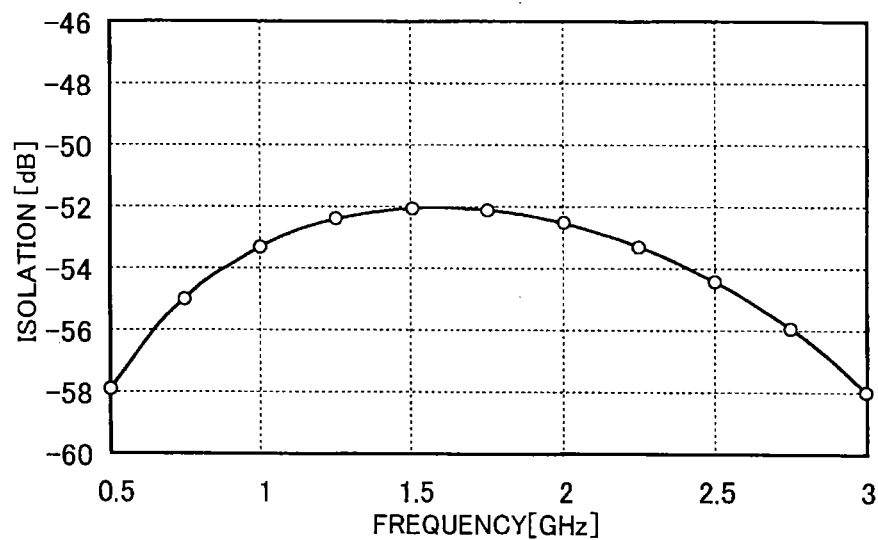
FIG. 16 is a graph representing the frequency characteristic (for isolation) of the coupler according to the other exemplary modification to the first embodiment.

FIGS. 13 and 14 show the result of a simulation which represents the frequency characteristic for the degree of coupling (FIG. 13) and isolation (FIG. 14), exhibited by a coupler which comprises an LPF unit including an L-type low pass filter between a coupling port and a secondary line, like the first embodiment, and FIGS. 15 and 16 show the result of a simulation which represents the frequency characteristic for the degree of coupling (FIG. 15) and isolation (FIG. 16) of a coupler which applies the second technique. For reference, in the configurations associated with FIGS. 13 and 14, inductors 22 within the LPF units both have the inductance of 0.3 nH, capacitors 23 both have the capacitance of 5 pF, and the capacitor 72 connected between an input port P1 and the ground has the capacitance of 0.16 pF.

As shown in FIGS. 13 through 16, the isolation (and therefore, the directivity as well) can be improved while maintaining a substantially equally flat degree of coupling by connecting the capacitor 72 between the input port P1 and the ground.

Notably, in the first and second techniques described above, it is believed that the added capacitors 71, 72 serve to cancel the lost balance of the phase difference between the induced current and displacement current generated on the secondary line 13, leading to alleviation from the deterioration in isolation and directivity.

[Flat Degree of Coupling Provided Through Formation of Resonant Point]

Next, a fourth and a fifth embodiment will be described in regard to providing a flat degree of coupling in a used frequency band by forming a resonant point in a region higher than the used frequency band.

[Fourth Embodiment]

A coupler according to a fourth embodiment of the present invention has the same circuit configuration as the coupler of the first embodiment shown in FIG. 1. Specifically, this coupler comprises a primary line 12 which has an input port P1 at one end thereof, and an output port P2 at the other end thereof, respectively; a secondary line 13 which has a coupling port P3 at one end thereof, and an isolation port P4 at the other end thereof, respectively, and is disposed in close proximity to the primary line 12 for electromagnetic coupling thereto; and an LPF unit 21 disposed between P3 and the secondary line 13.

The LPF unit is a so-called L-type low pass filter made up of an inductor 22 and a capacitor 23. Specifically, the inductor 22 is inserted in series between the secondary line 13 and coupling port P3, and the capacitor 23 is connected between a transmission line between the secondary line 13 and coupling port P3 and the ground.

Also, a used frequency band is set to 700 MHz (lower-limit frequency F1) to 2.7 GHz (higher-limit frequency F2), like the prior art example described above. For generating resonance at a neighboring point on a higher side of the frequency band, a selection was made to the inductor 22 having the inductance of 5.2 nH and the capacitor 23 having the capacitance of 2.7 pF for constructing the LPF unit 21. The thus selected components allowed the resonance to be generated near 5.0 GHz.

Figure 17:
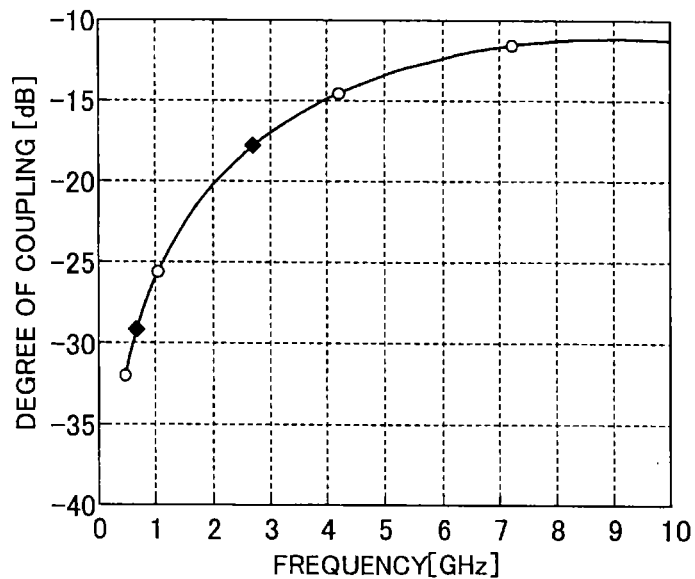
FIG. 17 is a graph showing the frequency characteristic for the degree of coupling of a coupler in a conventional structure.

For purposes of comparison, the frequency characteristic for the degree of coupling was calculated by a simulator for a coupler (conventional structure) which did not include the LPF unit 21, and FIG. 17 was plotted. As is apparent from FIG. 17, assuming, for example, a range of 700 MHz to 2.7 GHz for a used frequency band, a minimum value for the degree of coupling within this band is 29.1 dB at 700 MHz, and a maximum value is 17.8 dB at 2.7 GHz, so that a variation width Δ for the degree of coupling is calculated to be 11.3 dB. Consequently, this coupler cannot at all satisfy the prescription of 6 dB or lower, which is a generally required variation width.

Figure 18:
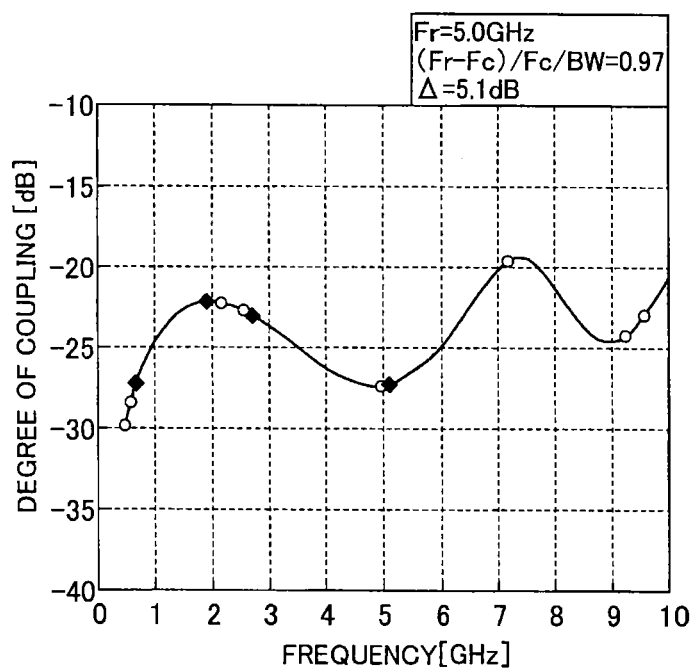
FIG. 18 is a graph representing the frequency characteristic for the degree of coupling of a coupler according to a fourth embodiment of the present invention.

In contrast, FIG. 18 shows the frequency characteristic for the degree of coupling of the coupler according to the fourth embodiment (result of simulation). As can be seen from FIG. 18, a minimum value for the degree of coupling within the band (700 MHz to 2.7 GHz) is 27.1 dB at 700 MHz, a maximum value is 22.1 dB at 1.8 GHz, and a variation width Δ for the degree of coupling is calculated to be 5.0 dB. Thus, the coupler according to the fourth embodiment can satisfy the prescription of 6 dB or lower, which is a generally required variation width.

The coupler according to the fourth embodiment can satisfy the prescription because the resonance (attenuation pole) was formed at 5.0 GHz by the actions of the LPF unit and electromagnetic coupling between the coupling lines (primary line and secondary line), and this resonance acts to prevent the degree of coupling from increasing in the used frequency band (700 MHz to 2.7 GHz), resulting in providing a flat degree of coupling in the used frequency band. In this regard, while another attenuation pole was found near 9.0 GHz (see FIG. 18), this attenuation pole is thought to be generated by secondary resonance introduced from self-resonance of the inductor and capacitor.

According to the coupler of the fourth embodiment as described above, by generating resonance at a neighboring position on the higher side of a used frequency band, the degree of coupling can be prevented from varying within the used frequency band to provide a flattened degree of coupling. Also, the flatness (variation width Δ) for the degree of coupling in the used frequency band varies depending on the position of the resonant point (where the resonant point should be formed). Next, a description will be given to this respect.

Figure 19:
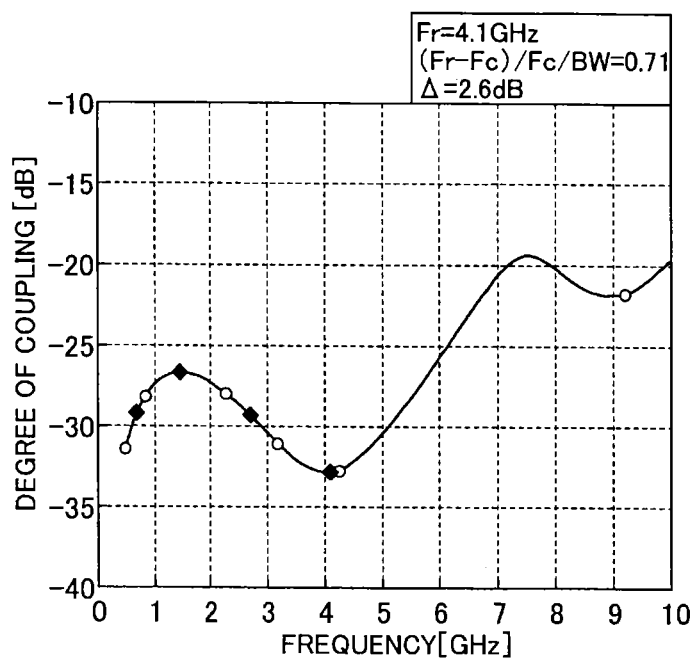
FIG. 19 is a graph representing the frequency characteristic for the degree of coupling when a resonant point is shifted to a lower band in the coupler according to the fourth embodiment.

FIG. 19 is a graph representing the frequency characteristic for the degree of coupling in an example (referred to as "Exemplary Modification 1") where the resonant point is shifted to a lower side. In this example, the inductor having the same inductance value (5.2 nH) was used, and a capacitor having the capacitance of 5.5 pF was used instead within the LPF unit in the example of FIG. 18 (fourth embodiment). By doing so, the resonant point was formed near 4.1 GHz, i.e., the resonant point was shifted to a lower side, allowing the resonant point to be brought closer to the used frequency band.

As a result, a minimum value for the degree of coupling within the band (700 MHz to 2.7 GHz) is 29.1 dB at 700 MHz, a maximum value is 26.6 dB at 1.45 GHz, and a variation width Δ for the degree of coupling is 2.6 dB which is further smaller than that of the fourth embodiment (FIG. 18). Thus, the coupler of Exemplary Modification 1 can sufficiently satisfy the prescription of 6 dB or less which is generally required. It should be noted that the variation width is preferably as small as possible for forming a stable APC circuit because a coupler, when served into a practical use, can suffer from variations during manufacturing, influences from other components used to form the circuit of the coupler, variations in characteristics, and the like.

Figure 20:
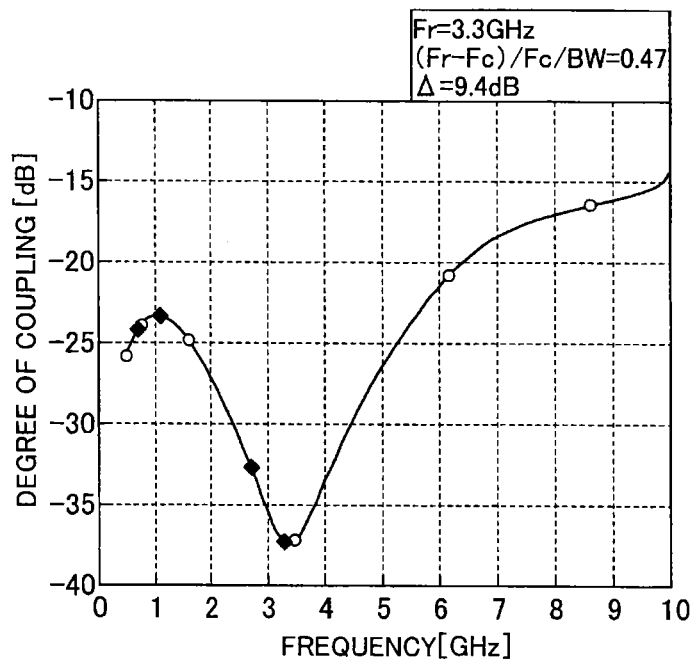
FIG. 20 is a graph representing the frequency characteristic for the degree of coupling when a resonant point is shifted further to the lower band than in FIG. 19 in the coupler according to the fourth embodiment.

FIG. 20 is a graph representing the frequency characteristic for the degree of coupling in an example (referred to as "Exemplary Modification 2") where the resonant point is further shifted to a lower side than in Exemplary Modification 1. To implement this configuration, in the Exemplary Modification 2, the inductance value was raised to 6.9 nH by increasing the diameter of the opening of the inductor in the LPF unit, and the capacitance was raised to 8.2 pF by increasing the area of opposing electrodes of the capacitor. As a result, the resonant point appeared near 3.3 GHz as shown in FIG. 20, thus allowing the resonant point to be further brought closer to the used frequency band.

In this Exemplary Modification 2, as can be seen from FIG. 20, a minimum value for the degree of coupling within the band (700 MHz to 2.7 GHz) is 37.8 dB at 2.7 GHz, a maximum value is 28.4 dB at 1.1 GHz, and a variation width Δ for the degree of coupling is calculated to be 9.4 dB. While the flatness was improved over the prior art example (FIG. 17), the coupler of Exemplary Modification 2 failed to satisfy the generally required variation width of 6 dB or less.

Further, for finding an optimal resonant position (resonant frequency), a simulation was performed to change the resonant point by varying the inductance of the inductor and the capacitance of the capacitor, included in the LPF unit. Specifically, in addition to the prior art example (FIG. 17), the fourth embodiment (resonant point Fr=5.0 GHz), Exemplary Modification 1 (resonant point Fr=4.1 GHz), and Exemplary Modification 2 (resonant point Fr=3.3 GHz), simulations were performed with the resonant point Fr set at 4.6 GHz (Exemplary Modification 3), at 4.2 GHz (Exemplary Modification 4), and at 3.9 GHz (Exemplary Modification 5), as shown in the following Table 1. Then, the difference between the resonant frequency Fr and the center frequency Fc was normalized by the bandwidth BW (=F2−F1) and the center frequency Fc, where F1 represents the lower limit frequency of the used frequency band; F2 the higher limit frequency; Fc the center frequency; BW the bandwidth; and Fr the frequency of the resonant point (resonant frequency), and an examination was made on the relationship between the normalized value (Fr−Fc)/Fc/BW and the variation width Δ for the degree of coupling in the used frequency band.

The results are as shown in the following Table 1 and FIGS. 21 and 22. In this simulation, the used frequency band was chosen to be from 700 MHz to 2.7 GHz. As such, F1=700 MHz, F2=2.7 GHz, and Fc=(0.7+2.7)/2=1.7 GHz. Also, since the resonant point was not detected in a range up to 10 GHz in the prior art example, the resonant frequency Fr was set to 10 GHz.

TABLE 1

| | Capacitance Value [pF] | Inductance Value [nH] | Resonant Frequency Fr [GHz] | Normalized value (Fr − Fc)/Fc/BW | Variation Width Δ [dB] |
|---|---|---|---|---|---|
| (1) Prior Art Example | — | — | 10.0 | 2.44 | 11.3 |
| (2) Fourth Embodiment/FIG. 18 | 2.7 | 5.2 | 5.0 | 0.97 | 5.1 |
| (3) Exemplary Modification 3 | 4.2 | 5.2 | 4.6 | 0.85 | 4.3 |
| (4) Exemplary Modification 4 | 4.9 | 5.2 | 4.2 | 0.74 | 2.9 |
| (5) Exemplary Modification 1/FIG. 19 | 5.5 | 5.2 | 4.1 | 0.71 | 2.6 |
| (6) Exemplary Modification 5 | 8.2 | 5.2 | 3.9 | 0.65 | 4.5 |
| (7) Exemplary Modification 2/FIG. 20 | 8.2 | 6.9 | 3.3 | 0.47 | 9.4 |

Figure 21:
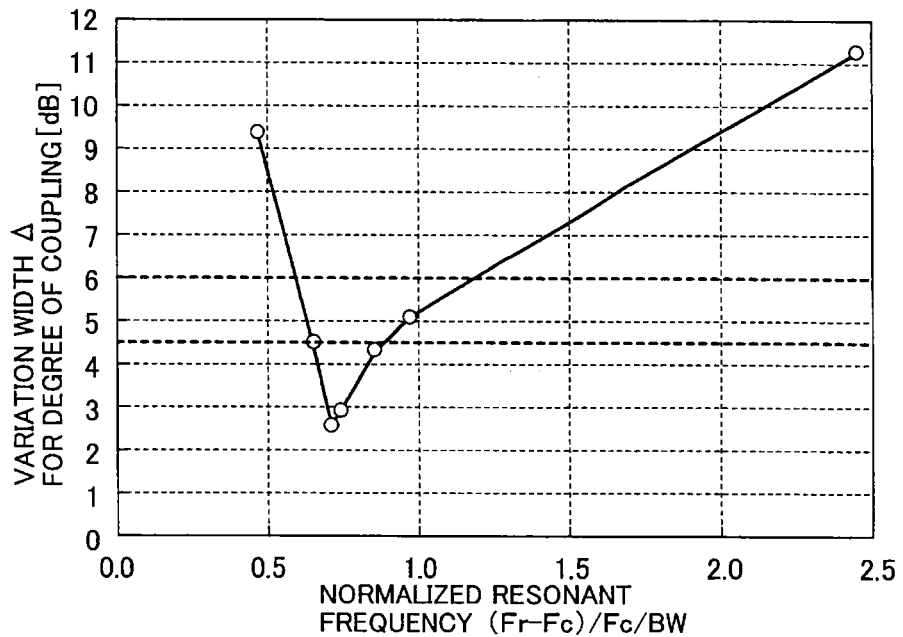
FIG. 21 is a graph representing a variation width Δ of the degree of coupling within a used frequency band when the resonant point is varied in the coupler according to the fourth embodiment.
Figure 22:
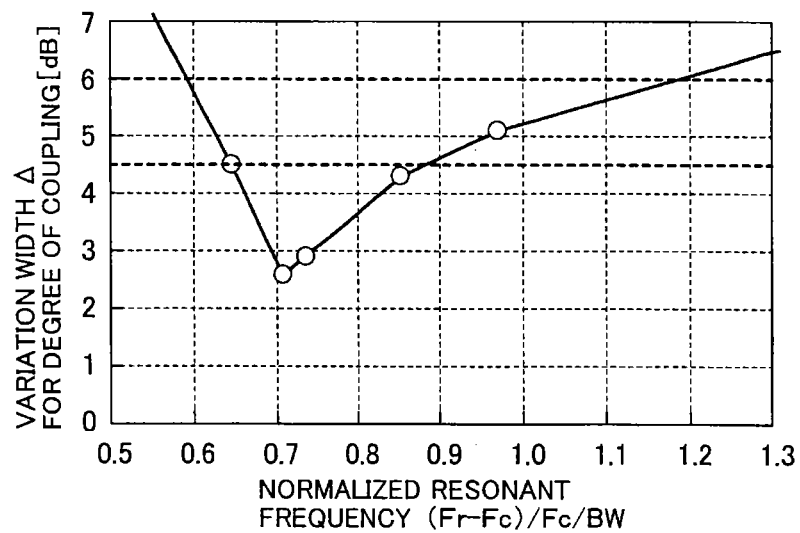
FIG. 22 is a graph showing part of the graph of FIG. 21 in enlarged view.

As can be seen from Table 1 above and FIGS. 21 and 22, the relationship between the used frequency band and the resonant frequency is such that the resonant point does not exert significant effects on the flattening, as is the case with the prior art example, if the resonant point is far away from the used frequency band into the higher side, while the resonant point excessively close to the used frequency band results in compromised flatness for the degree of coupling. Thus, for accomplishing a variation width of 6 dB or less which is generally required, the resonant point may be set such that the normalized value (Fr−Fc)/Fc/BW lies in a range of 0.6 to 1.2 (see FIGS. 21 and 22). For accomplishing a variation width of 4.5 dB or less which is considered more preferable, the resonant point may be set such that the normalized value (Fr−Fc)/Fc/BW lies in a range of 0.65 to 0.9.

[Fifth Embodiment]

A coupler according to a fifth embodiment of the present invention has the same circuit configuration as the coupler of the third embodiment shown in FIG. 6. Specifically, this coupler comprises an LPF unit (first LPF unit) 51 between a secondary line 13 and P3, in a manner similar to the fourth embodiment, and additionally comprises an LPF unit (second LPF unit) 61 between the secondary line 13 and P4 as well. Each of the LPF units 51, 61 is an L-type low pass filter made up of an inductor 52, 62 and a capacitor 53, 63, again in a manner similar to the fourth embodiment. Also, a capacitor 65 is connected between P3 and P4.

Figure 23:
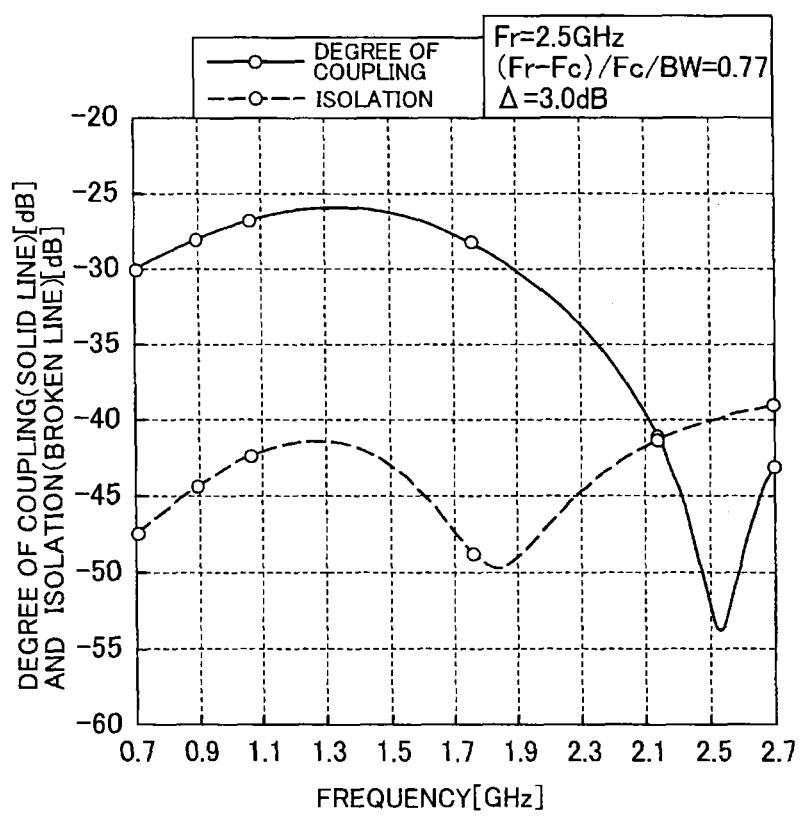
FIG. 23 is a graph representing the frequency characteristic for the degree of coupling and isolation of a coupler according to a fifth embodiment of the present invention.

FIG. 23 shows the frequency characteristics for the degree of coupling and isolation of the coupler according to the fifth embodiment. In this embodiment, a used frequency band is assumed to be from 800 MHz to 1.9 GHz (F1=800 MHz, F2=1.9 GHz, center frequency Fc=1.35 GHz, BW=1.1 GHz), and a selection was made to the inductors 52, 62 having the inductance of 6.2 nH and the capacitor 53, 63 having the capacitance of 1.9 pF for constructing the LPF units 51, 61, respectively, and the capacitor 65 between P3 and P4 having the capacitance of 1.1 pF, thereby forming the resonant point (Fr) at 2.5 GHz. In this event, the normalized value (Fr−Fc)/Fc/BW is calculated to be 0.77 for the resonant point.

Again according to the fifth embodiment, a variation width Δ for the degree of coupling is as small as 3 dB, so that the coupler of this embodiment can satisfy a variation width of 6 dB or less which is generally required. In addition, the coupler of this embodiment can satisfy the directivity (difference between the isolation and the degree of coupling) of 20 dB which is generally required as well.

Also, the fourth and fifth embodiment employ the normalized value (calculated by normalizing the difference between the resonant frequency and the center frequency of the used band by the bandwidth and center frequency) for the resonant point, and provide for flattening of the degree of coupling in the used frequency band by adjusting the normalized value to be within a predetermined range. Alternatively, in another aspect of the present invention, the degree of coupling can be similarly made flat in the used frequency band by forming the resonant point at such a frequency position that allows the degree of coupling at the lower limit frequency F1 to be substantially equal to the degree of coupling at the higher limit frequency F2.

For example, the used frequency band is from 800 MHz to 1.9 GHz in the fifth embodiment (FIG. 23), where the degree of coupling at the lower limit frequency F1 (800 MHz) is substantially equal to the degree of coupling at the higher limit frequency F2 (1.9 GHz), thereby improving the flatness for the degree of coupling within the used frequency band. Also, as to Exemplary Modification 1 described above (FIG. 19), which keeps the variation width Δ the smallest, the degree of coupling (29.1 dB) at the lower limit frequency F1 (700 MHz) is substantially equal to the degree of coupling (29.2 dB) at the higher limit frequency F2 (1.9 GHz), which allows for satisfactory flatness for the degree of coupling within the used frequency.

In this way, it is also possible to provide for the flatness for the degree of coupling in the used frequency band by an approach which involves forming the resonant point at such a frequency position that allows the degree of coupling at the lower limit frequency F1 to be substantially equal to the degree of coupling at the higher limit frequency F2.

[Sixth Embodiment]

Figure 24:
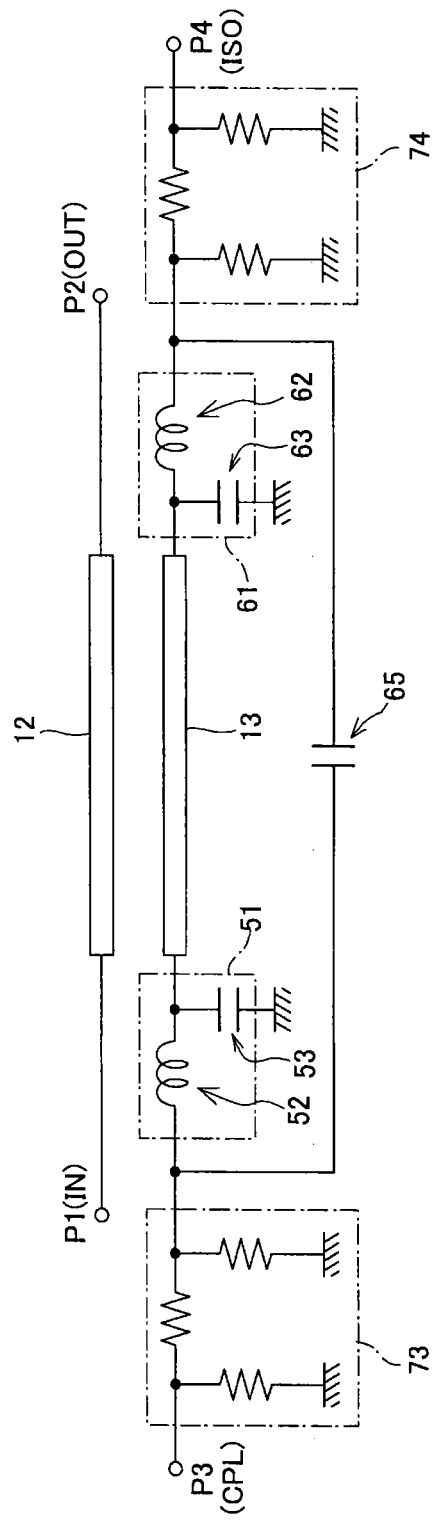
FIG. 24 is a diagram showing a coupler according to a sixth embodiment of the present invention.
Figure 25:
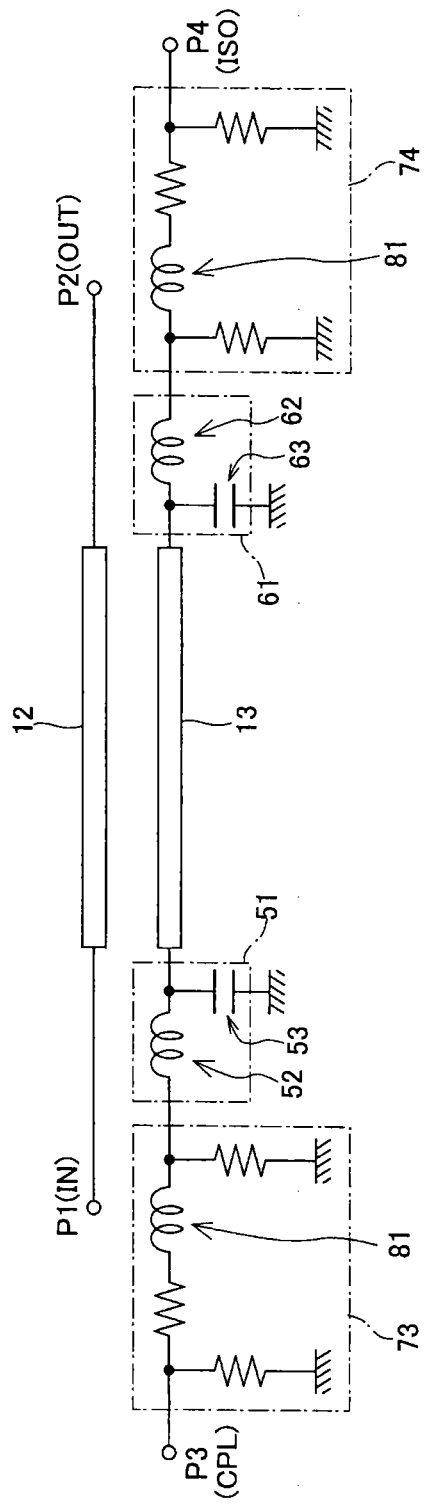
FIG. 25 is a diagram showing a coupler according to an exemplary modification to the sixth embodiment.

As shown in FIG. 24, a coupler according to a sixth embodiment of the present invention comprises LPF units 51, 61 at both ends of a secondary line 13, respectively, and a capacitor 65 connected between P3 and P4, in a manner similar to the third and fifth embodiments described above, and additionally comprises attenuators 73, 74 connected between the secondary line 13 (LPF unit 51) and P3 and between the secondary line 13 (LPF unit 61) and P4, respectively.

The attenuators 73, 74 thus added to the secondary line 13 can facilitate mitigating the influence of varying impedance of other circuit elements connected to the secondary line 13, as described above. It should be appreciated that in each of the couplers according to the first through fifth embodiments and exemplary modifications, attenuators may be connected between P3 and the secondary line 13 (LPF unit 21, 31, 51) and between P4 and the secondary line 13 (LPF unit 41, 61) in a manner similar to the sixth embodiment.

Additionally, a reactance component (reactance unit) may further be added to the coupler which includes the attenuators as described above. This is intended to optimize the degree of coupling, directivity, and the like of the coupler by adjusting the impedance.

Figure 26:
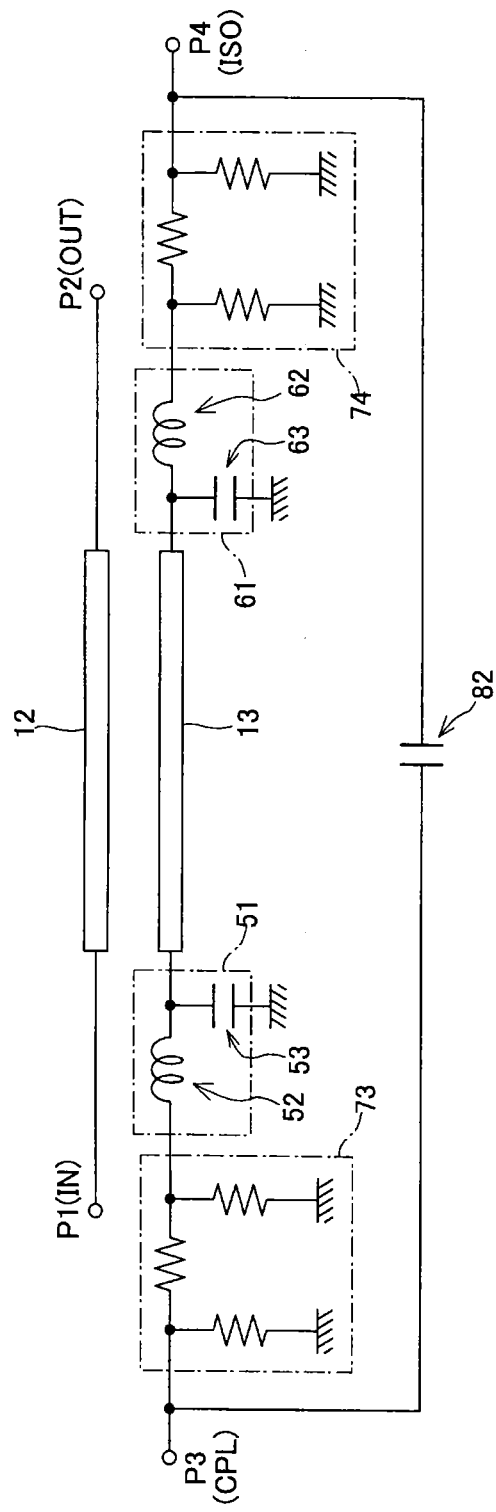
FIG. 26 is a diagram showing a coupler according to another exemplary modification to the sixth embodiment.

Specifically, the attenuator may be constructed of resistive elements connected in a so-called π-shaped configuration or in a T-shaped configuration, as shown in FIG. 24. Then, the reactance component may be added by connecting an inductor 81 within each attenuator 73, 74 (in series to a serially connected resistive elements within each attenuator 73, 74. Alternatively, as shown in FIG. 26, a capacitor 82 may be added as the reactance component by connecting one end of the capacitor 82 between P3 and the attenuator 73 and the other end of the same between P4 and the attenuator 74.

While several embodiments of the present invention have been described above, it should be apparent to those skilled in the art that the present invention is not limited to those embodiments, but a variety of modifications can be made without departing from the scope of the invention defined by the appended claims.

For example, the present invention is not limited to the used frequency bands or bandwidths specifically shown in the embodiments, but may be used in other frequency bands and bandwidths. Also, while the foregoing embodiments have employed the LPF units which are implemented by L-type low pass filters or π-type low pass filters, the present invention can employ other types of low pass filters as required, such as a so-called T-type low pass filter which is made up of two serially connected inductors and a capacitor connected between a point between these two inductors and the ground. As appreciated, quadratic L-type low pass filters, if used as the LPF units as in the aforementioned embodiments, have the advantage of reducing the number of elements and the length of routed conductor lines and preventing unwanted coupling components and resonance from occurring, as compared with the case where ternary π-type low pass filters are employed.

What is claimed is:

1. A directional coupler comprising:
a primary line for transmitting a transmission signal;
an input port provided at one end of said primary line for inputting the transmission signal to said primary line;
an output port provided at the other end of said primary line for outputting the transmission signal from said primary line;

a secondary line for electromagnetically coupling with said primary line to extract part of the transmission signal;
a coupling port provided at one end of said secondary line;
an isolation port provided at the other end of said secondary line; and
a low pass filter unit having a function of low pass filter, disposed between said secondary line and said coupling port, wherein:
said low pass filter unit is configured to form a resonant point on a higher side of a used frequency band to provide a flat degree of coupling in the used frequency band.

2. The directional coupler according to claim 1, wherein:
the difference between a resonant frequency Fr and a center frequency Fc is normalized by the bandwidth BW and the center frequency to derive a value (Fr-Fc)/Fc/BW, said value being within a range of 0.6 to 1.2 inclusive, where:
said used frequency band is defined by a lower limit frequency F1, a higher limit frequency F2, the center frequency Fc, and the bandwidth BW, and
said resonant frequency Fr is the frequency at said resonant point.

3. The directional coupler according to claim 2, wherein:
said value (Fr-Fc)/Fc/BW is within a range of 0.65 to 0.9 inclusive.

4. The directional coupler according to claim 1, wherein:
said resonant point is formed such that the degree of coupling at the lower limit frequency of the used frequency band is substantially equal to the degree of coupling at the higher limit frequency of the used frequency band.

5. The directional coupler according to claim 1, wherein said low pass filter unit includes:
an inductor connected in series between said secondary line and said coupling port; and
a capacitor having one end connected between said secondary line and said coupling port and the other end connected to the ground.

6. The directional coupler according to claim 1, further comprising:
a capacitor having one end connected between said primary line and said input port and the other end connected between said secondary line and said coupling port.

7. The directional coupler according to claim 1, further comprising:
a capacitor having one end connected between said primary line and said input port, and the other end connected to the ground.

8. The directional coupler according to claim 1, further comprising in addition to said low pass filter unit:
another low pass filter unit having a function of low pass filter, disposed between said secondary line and said isolation port.

9. The directional coupler according to claim 8, wherein:
said low pass filter disposed between said secondary line and said coupling port includes:
an inductor connected in series between said secondary line and said coupling port; and
a capacitor having one end connected between said secondary line and said coupling port and the other end connected to the ground, and
said low pass filter unit disposed between said secondary line and said isolation port includes:
an inductor connected in series between said secondary line and said isolation port; and
a capacitor having one end connected between said secondary line and said isolation port and the other end connected to the ground.

10. The directional coupler according to claim 8, further comprising:
a capacitor having one end connected between said secondary line and said coupling port, and the other end connected between said secondary line and said isolation port.

11. The directional coupler according to claim 1, further comprising:
an attenuator connected one or both of between said secondary line and said coupling port and between said secondary line and said isolation port.

12. The directional coupler according to claim 8, further comprising:
an attenuator connected one or both of between said secondary line and said coupling port and between said secondary line and said isolation port.

13. The directional coupler according to claim 11, further comprising:
a reactance unit having a reactive element, connected within said attenuator or between said coupling port and said isolation port.

14. The directional coupler according to claim 12, further comprising:
a reactance unit having a reactive element, connected within said attenuator or between said coupling port and said isolation port.

15. A radio communication device comprising:
an antenna capable of transmitting a signal;
a directional coupler for detecting a level of a transmission signal transmitted to said antenna; and
a transmitter circuit capable of generating at least a transmission signal in a
first communication frequency band and a transmission signal in a second communication
frequency band different from the first conummication frequency band,
wherein said directional coupler is connected between said antenna and said
transmission circuit such that said radio communication device can receive both the
transmission signal in the first communication frequency band and the transmission signal in
the second communication frequency band, and
said radio communication device comprises the directional coupler according to claim 1 as said directional coupler.

16. A radio communication device comprising:
an antenna capable of transmitting a signal;
a directional coupler for detecting a level of a transmission signal transmitted to said antenna; and
a transmitter circuit capable of generating at least a transmission signal in a first communication frequency band and a transmission signal in a second communication frequency band different from the first communication frequency band,
wherein said directional coupler is connected between said antenna and said transmission circuit such that said radio communication device can receive both the transmission signal in the first communication frequency band and the transmission signal in the second communication frequency band, and
said radio communication device comprises the directional coupler according to claim 8 as said directional coupler.

17. A radio communication device comprising:
an antenna capable of transmitting a signal;
a directional coupler for detecting a level of a transmission signal transmitted to said antenna; and a transmitter circuit capable of generating at least a transmission signal in a first communication frequency band and a transmission signal in a second communication frequency band different from the first communication frequency band, wherein said directional coupler is connected between said antenna and said transmission circuit such that said radio communication device can receive both the transmission signal in the first communication frequency band and the transmission signal in the second communication frequency band, and said radio communication device comprises the directional coupler according to claim 11 as said directional coupler.

\* \* \* \* \*